(12) United States Patent
Ogura et al.

(10) Patent No.: US 10,306,755 B2
(45) Date of Patent: May 28, 2019

(54) STRETCHABLE BOARD

(71) Applicant: FUJIKURA LTD., Tokyo (JP)

(72) Inventors: Shingo Ogura, Chiba (JP); Tetsu Hammura, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/534,394

(22) PCT Filed: Dec. 8, 2015

(86) PCT No.: PCT/JP2015/084355
§ 371 (c)(1),
(2) Date: Jun. 8, 2017

(87) PCT Pub. No.: WO2016/093210
PCT Pub. Date: Jun. 16, 2016

(65) Prior Publication Data
US 2018/0263114 A1    Sep. 13, 2018

(30) Foreign Application Priority Data

Dec. 8, 2014    (JP) .................................. 2014-247671

(51) Int. Cl.
*H05K 1/02*    (2006.01)
*H05K 1/18*    (2006.01)
(Continued)

(52) U.S. Cl.
CPC ......... *H05K 1/0283* (2013.01); *H05K 1/0281* (2013.01); *H05K 1/0296* (2013.01);
(Continued)

(58) Field of Classification Search
CPC .... H05K 1/0283; H05K 1/0296; H05K 1/189; H05K 1/181; H05K 2201/09227; H05K 2201/09272
(Continued)

(56) References Cited

U.S. PATENT DOCUMENTS

2004/0065962 A1*    4/2004    Shinomiya ........ H01L 23/49838
257/776
2004/0192082 A1*    9/2004    Wagner ................ H05K 1/0283
439/67
(Continued)

FOREIGN PATENT DOCUMENTS

CN    102971841 A    3/2013
JP    2006-108657 A    4/2006
(Continued)

OTHER PUBLICATIONS

Office Action in corresponding Taiwanese Patent Application No. 104141050 dated Nov. 15, 2015 (6 pages).
(Continued)

*Primary Examiner* — Steven T Sawyer
(74) *Attorney, Agent, or Firm* — Osha Liang LLP

(57) ABSTRACT

A stretchable board includes: a base material having stretchability; first and second electronic components mounted on the base material; a wire arranged on the base material; and first and second connectors for connecting the first and second electronic components and the wire to each other. At least a portion of the first electronic component and at least a portion of the second electronic component face each other in a planned stretching direction in which the base material includes: a facing zone interposed between the first and second electronic components in a planned stretching direction and a non-facing zone other than the facing zone on the base material, in which at least a portion of the first connector or at least a portion of the second connector are arranged in the non-facing zone, and in which at least one of the wires is arranged in the non-facing zone.

5 Claims, 10 Drawing Sheets

(51) Int. Cl.
  *H05K 1/11* (2006.01)
  *H05K 3/34* (2006.01)
(52) U.S. Cl.
  CPC ............. *H05K 1/181* (2013.01); *H05K 1/189* (2013.01); *H05K 1/0271* (2013.01); *H05K 1/118* (2013.01); *H05K 3/3442* (2013.01); *H05K 2201/0989* (2013.01); *H05K 2201/09227* (2013.01); *H05K 2201/09263* (2013.01); *H05K 2201/09281* (2013.01); *H05K 2201/09381* (2013.01); *H05K 2201/09409* (2013.01); *H05K 2201/09845* (2013.01); *H05K 2201/10522* (2013.01); *Y02P 70/611* (2015.11)
(58) Field of Classification Search
  USPC .......................................... 174/254; 361/749
  See application file for complete search history.

(56) References Cited

U.S. PATENT DOCUMENTS

| | | |
|---|---|---|
| 2005/0227389 A1 | 10/2005 | Bhattacharya et al. |
| 2006/0056161 A1 | 3/2006 | Shin et al. |
| 2006/0169989 A1 | 8/2006 | Bhattacharya et al. |
| 2009/0273909 A1 | 11/2009 | Shin et al. |
| 2010/0051326 A1 | 3/2010 | Sagisaka |
| 2010/0087782 A1 | 4/2010 | Ghaffari et al. |
| 2010/0116526 A1 | 5/2010 | Arora et al. |
| 2010/0178722 A1 | 7/2010 | de Graff et al. |
| 2010/0271191 A1 | 10/2010 | de Graff et al. |
| 2010/0298895 A1 | 11/2010 | Ghaffari et al. |
| 2011/0034912 A1 | 2/2011 | de Graff et al. |
| 2012/0051005 A1 | 3/2012 | Vanfleteren et al. |
| 2012/0226130 A1 | 9/2012 | De Graff et al. |
| 2013/0074331 A1 | 3/2013 | Brun |
| 2013/0150693 A1 | 6/2013 | D'Angelo et al. |
| 2013/0225965 A1 | 8/2013 | Ghaffari et al. |
| 2013/0274562 A1 | 10/2013 | Ghaffari et al. |
| 2013/0313713 A1 | 11/2013 | Arora et al. |
| 2013/0316487 A1 | 11/2013 | de Graff et al. |
| 2014/0012160 A1 | 1/2014 | Ghaffari et al. |
| 2014/0039290 A1 | 2/2014 | De Graff et al. |
| 2014/0299362 A1 | 10/2014 | Park et al. |
| 2014/0303452 A1 | 10/2014 | Ghaffari |
| 2014/0340857 A1 | 11/2014 | Hsu et al. |
| 2015/0069617 A1 | 3/2015 | Arora et al. |
| 2015/0099976 A1 | 4/2015 | Ghaffari et al. |
| 2015/0272652 A1 | 10/2015 | Ghaffari et al. |
| 2015/0320472 A1 | 11/2015 | Ghaffari et al. |
| 2016/0027834 A1 | 1/2016 | Graff et al. |
| 2016/0045162 A1 | 2/2016 | De Graff et al. |
| 2016/0135740 A1 | 5/2016 | Ghaffari et al. |
| 2016/0270223 A1* | 9/2016 | Cherenack .......... H05K 1/0283 |
| 2017/0079588 A1 | 3/2017 | Ghaffari et al. |
| 2017/0079589 A1 | 3/2017 | Ghaffari et al. |
| 2017/0086747 A1 | 3/2017 | Ghaffari et al. |
| 2017/0086748 A1 | 3/2017 | Ghaffari et al. |
| 2017/0086749 A1 | 3/2017 | Ghaffari et al. |
| 2017/0110417 A1 | 4/2017 | Arora et al. |

FOREIGN PATENT DOCUMENTS

| | | |
|---|---|---|
| JP | 2010-539650 A | 12/2010 |
| JP | 2012-508984 A | 4/2012 |
| JP | 2013-145842 A | 7/2013 |
| JP | 2013-187380 A | 9/2013 |
| WO | 2003/021679 A2 | 3/2003 |
| WO | 2010/086033 A1 | 8/2010 |
| WO | 2017/003531 A1 | 1/2017 |

OTHER PUBLICATIONS

Office Action in counterpart Chinese Patent Application No. 201580061857.7 dated Oct. 25, 2018 (13 pages).
Extended European Search Report issued in corresponding European Application No. 15866432.6 dated Aug. 21, 2018 (9 pages).

* cited by examiner

FIG.2
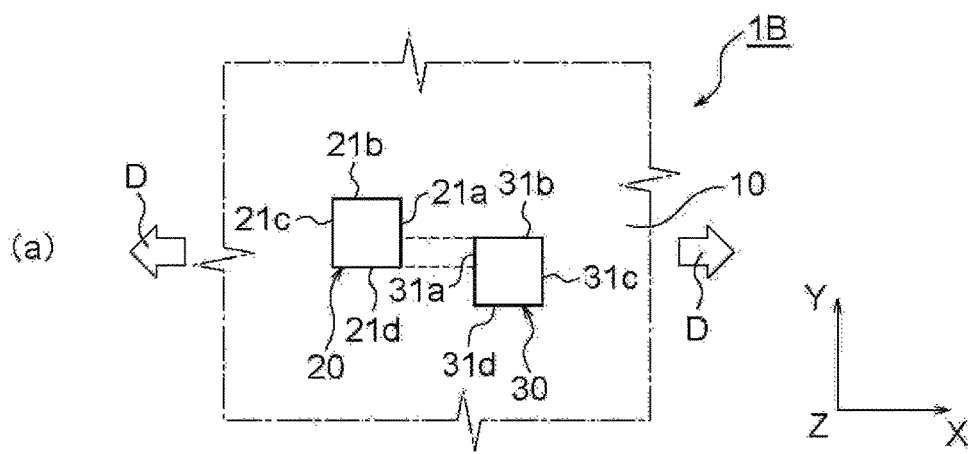
(a)
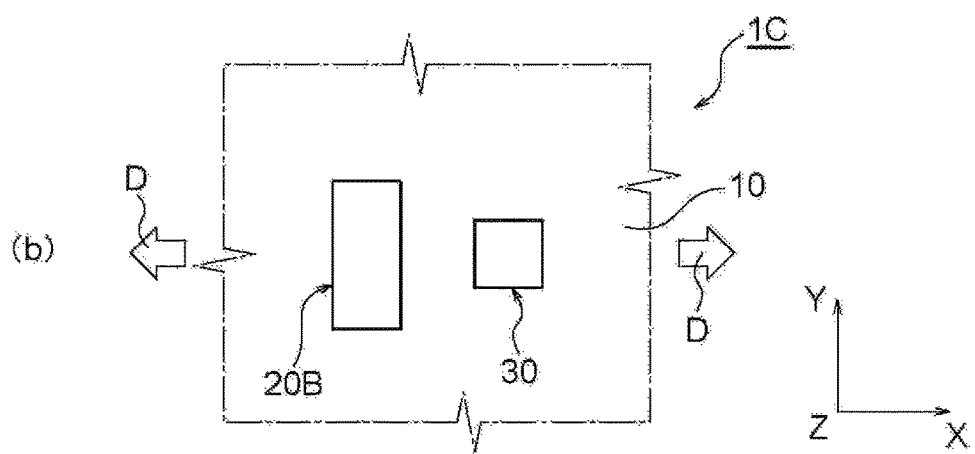
(b)

STRETCHABLE BOARD

TECHNICAL FIELD

One or more embodiments of the present invention relate to a stretchable board.

For designated countries that are permitted to be incorporated by reference in documents, the content described in Japanese Patent Application No. 2014-247671 filed in Japan on Dec. 8, 2014 is incorporated herein by reference and by a portion of described in this specification.

BACKGROUND

There is known a flexible circuit boards in which a stretch prevention guard which prevents stretching and contracting of a zone including an electric connector of a stretchable circuit body is provided to a non-stretchable component-mounting board in order to suppress destruction of the electric connector caused by concentration of stress between the non-stretchable component-mounting board and the stretchable circuit body (for example, refer to Patent Document 1).

CITATION LIST

Patent Document

Patent Document 1: JP 2013-145842 A

SUMMARY

In the above technique, there is a problem of causing a degradation in stretchability of the flexible circuit board by the stretch prevention guard.

One or more embodiments of the present invention provide a stretchable board that suppresses a degradation in stretchability and also suppresses destruction of a connector for electrically connecting electronic components through wires.

[1] According to an aspect of one or more embodiments of the invention, there is provided a stretchable board including: a base material having stretchability; a first electronic component mounted on the base material; a second electronic component mounted on the base material; a wire arranged on the base material; a first connector electrically connecting the first electronic component and the wire to each other; and a second connector electrically connecting the second electronic component and the wire to each other, in which at least a portion of the first electronic component and at least a portion of the second electronic component face each other in a planned stretching direction of the stretchable board, in which the base material includes: a facing zone interposed between the first and second electronic components in the planned stretching direction; and a non-facing zone other than the facing zone on the base material, in which at least a portion of the first connector and at least a portion of the second connector are arranged in the non-facing zone, and in which at least one of the wires is arranged in the non-facing zone.

[2] In one or more embodiments of the above invention, outer shapes of the first and second electronic components may be substantially rectangular shapes having four sides in a plan view.

[3] In one or more embodiments of the above invention, the outer shape of the first electronic component, in a plan view, includes: a first side substantially perpendicular to the planned stretching direction; and a second side intersecting the first side, in which the outer shape of the second electronic component, in a plan view, includes: a third side substantially perpendicular to the planned stretching direction; and a fourth side intersecting the third side, in which the first and second electronic components are arranged so that the first and third sides face each other in a plan view, in which the second and fourth sides are located substantially on the same side with respect to an virtual center line along the planned stretching direction passing through a center of the facing zone in a plan view, and in which the wire, in a plan view, is led out from the second side and is led out from the fourth side.

[4] In one or more embodiments of the above invention, the stretchable board may include: a plurality of the first connectors, a plurality of the second connectors, and a plurality of the wires, in which all of the plurality of the first connectors, all of the plurality of the second connectors, and all of the plurality of the wires may be arranged in the non-facing zone.

[5] According to another aspect of one or more embodiments of the invention, there is provided a stretchable board including: a base material having stretchability, and a wire arranged on the base material, in which the base material includes first and second mounting portions on which first and second electronic components electrically connected to each other by the wire can be mounted, in which at least a portion of the first mounting portion and at least a portion of the second mounting portion face each other in the planned stretching direction of the stretchable board, in which the base material includes: a facing zone interposed between the first and second mounting portions in the planned stretching direction; and a non-facing zone being other than the facing zone of the base material and including the first and second mounting portions, and in which at least one of the wires is arranged in the non-facing zone.

Effect of the Invention

According to one or more embodiments of the invention, by providing at least one of at least a portion of the first connector and at least a portion of the second connector in the non-facing zone where the stress caused by the stretching and contracting is hardly concentrated, so that it is possible to suppress the destruction of the connectors in the non-facing zone. In addition, in one or more embodiments of the invention, by configuring the stretchable board in a simple structure in comparison with a case where the stretch prevention guard is arranged on the stretchable board, it is possible to suppress the degradation in stretchability of the stretchable board.

BRIEF DESCRIPTION OF DRAWINGS

FIG. 1(a) is a plan view, and FIG. 1(b) is cross-sectional view taken along line Ib-Ib in FIG. 1;

FIG. 2(a) is a plan view illustrating a schematic configuration of a Modified Example 1 of the stretchable board according to one or more embodiments of the invention, and FIG. 2(b) is a plan view illustrating a schematic configuration of Modified Example 2 of the stretchable board according to one or more embodiments of the invention;

Hereinafter, embodiments of the invention will be described with reference to the drawings.

Figure 1:
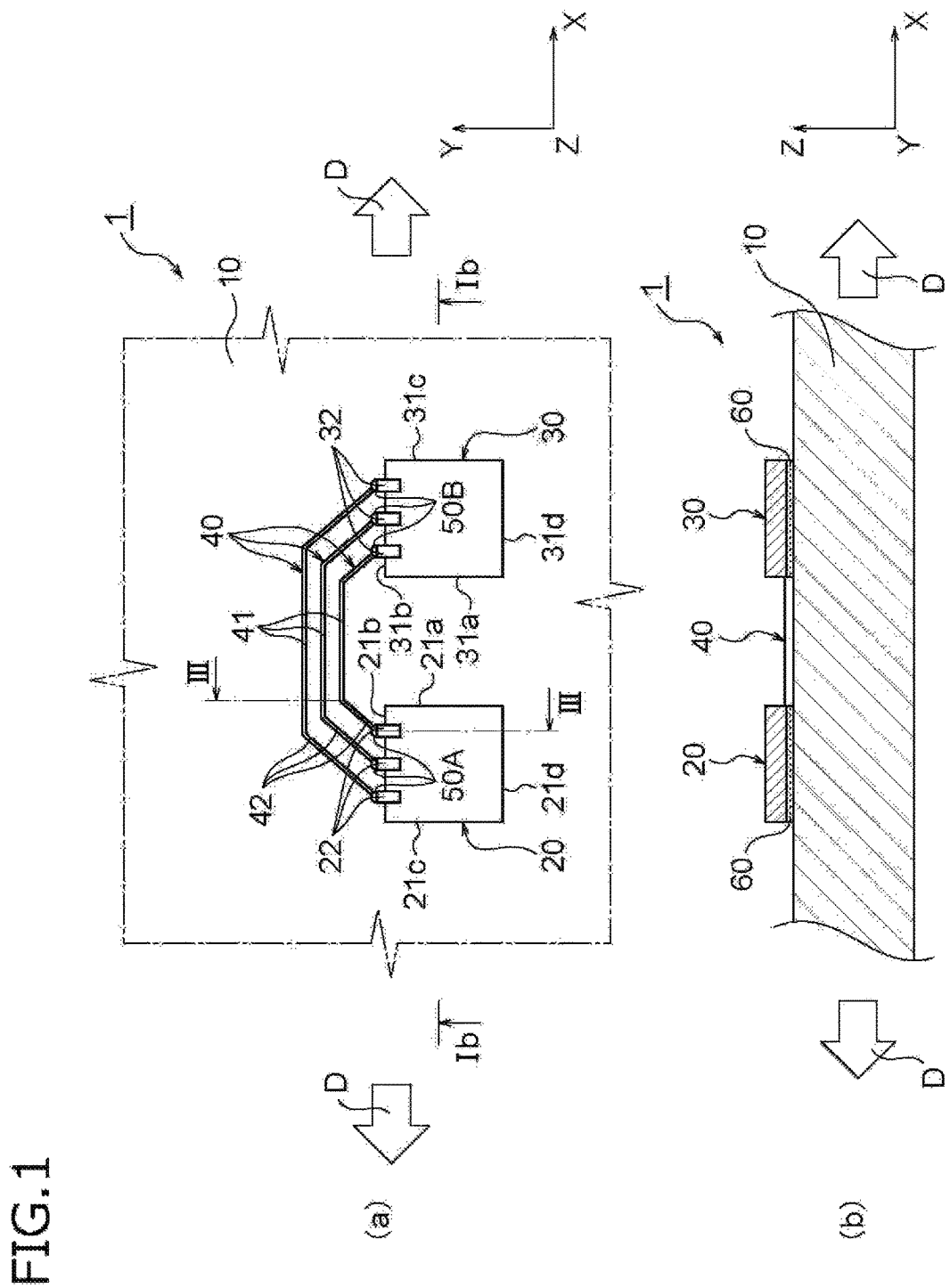
FIG. 1 is a view illustrating a schematic configuration of a stretchable board according to one or more embodiments of the invention.
Figure 3:
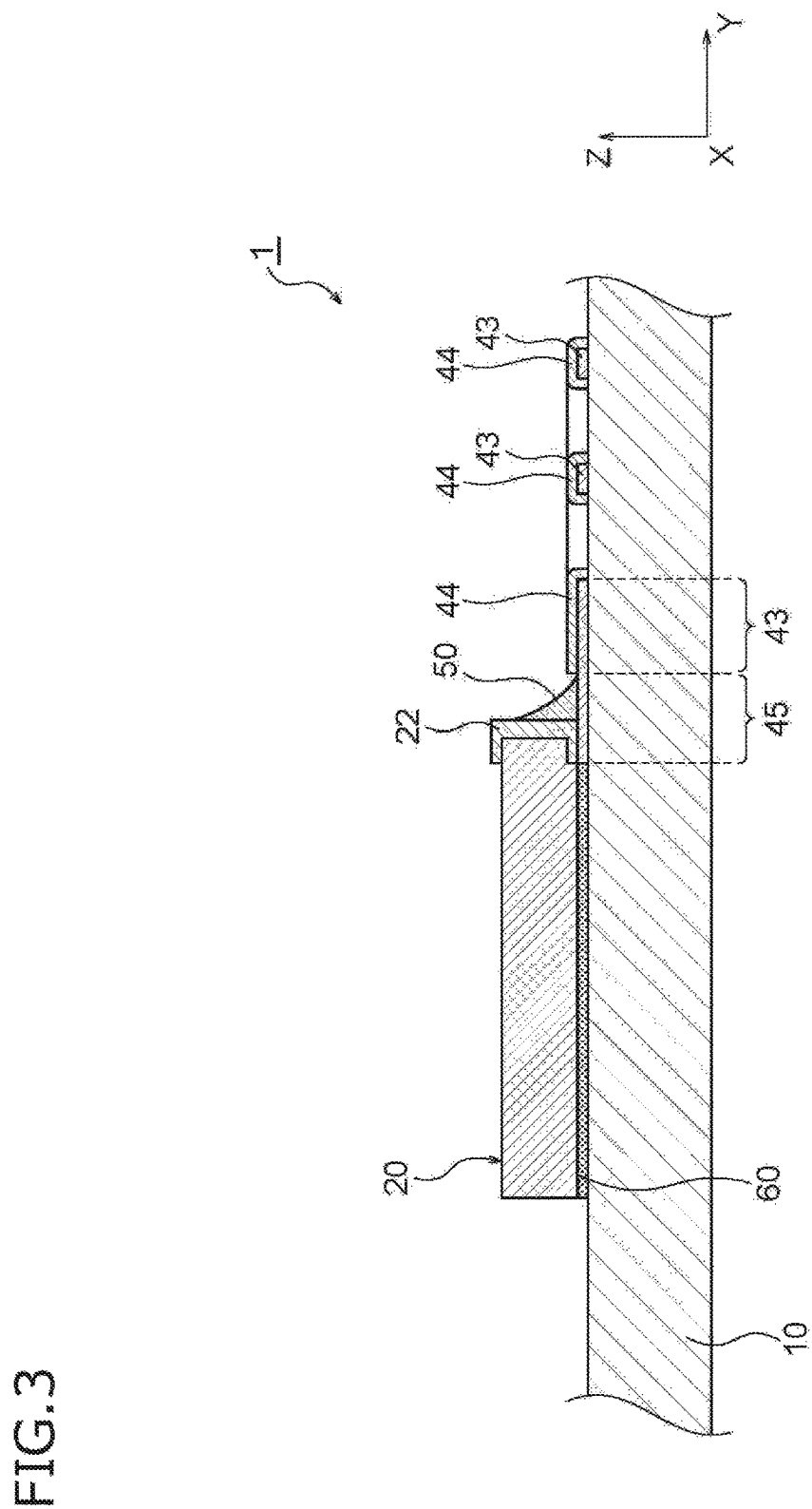
FIG. 3 is a cross-sectional view taken along line III-III in FIG. 1.
Figure 4:
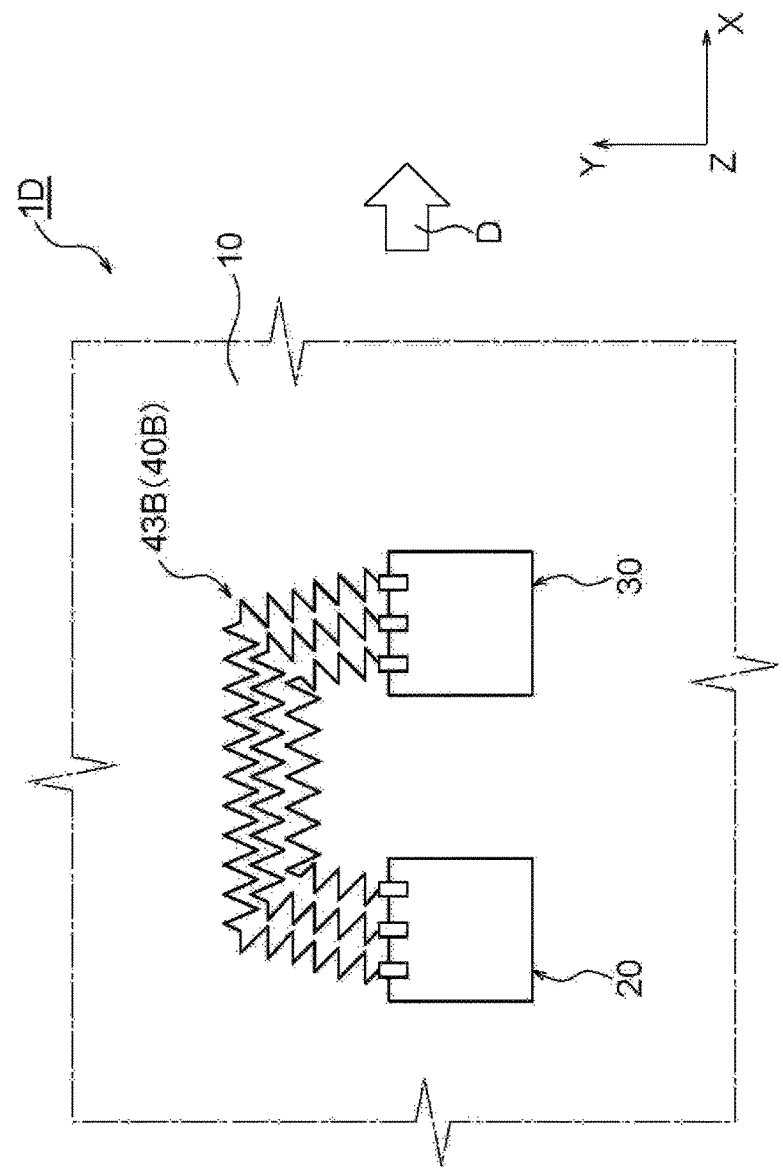
FIG. 4 is a plan view illustrating a schematic configuration of Modified Example 3 of the stretchable board according to one or more embodiments of the invention.

FIG. 1 is a view illustrating a schematic configuration of a stretchable board according to one or more embodiments of the invention, FIG. 1(a) is a plan view, and FIG. 1(b) is cross-sectional view taken along line Ib-Ib in FIG. 1. FIG. 2(a) is a plan view illustrating a schematic configuration of a Modified Example 1 of the stretchable board according to one or more embodiments of the invention, and FIG. 2(b) is a plan view illustrating a schematic configuration of Modified Example 2 of the stretchable board according to one or more embodiments of the invention. FIG. 3 is a cross-sectional view taken along line in FIG. 1. FIG. 4 is a plan view illustrating a schematic configuration of Modified Example 3 of the stretchable board according to one or more embodiments of the invention.

As illustrated in FIGS. 1(a) and 1(b) and FIG. 3, the stretchable circuit board 1 according to one or more embodiments includes a base material 10 (substrate), a first electronic component 20, a second electronic component 30, wires 40, connectors 50A and 50 B, and an underfill 60. For example, the stretchable board 1 is used for an application for following movement in a movable portion, a stretchable portion, or the like of a robot arm or an application of being arranged so as to cover a surface of an object having a complicated shape.

The base material 10 is made of a material having stretchability and is made of a material having a Young's modulus of 0.1 MPa to 100 MPa. In one or more embodiments, as a material constituting the base material 10, from the practical viewpoint, preferably, a material having a Young's modulus of 1 MPa to 100 MPa is used, and more preferably a material having a Young's modulus of 30 MPa to 90 MPa is used. As a specific example of the material constituting the base material 10, there may be exemplified an elastic sheet made of an elastomer, a resin film, or the like. As a specific example of the elastic sheet, there may be exemplified sheets of natural rubber, styrene butadiene rubber, butadiene rubber, chloroprene rubber, butyl rubber, nitrile rubber, ethylene propylene rubber, acrylic rubber, urethane rubber, silicone rubber, fluororubber, and the like. As a specific example of the resin film, there may be exemplified films of nylon, polyester, acrylic, polyamide, and the like. The "base material 10" in one or more embodiments corresponds to an example of a "base material" in one or more embodiments of the invention.

On the other hand, the first and second electronic components 20 and 30 are not stretchable curvedly or planarly, unlike the base material 10. The first and second electronic components 20 and 30 are surface-mounted-type electronic components and form a circuit together with wires 40 and connectors 50A and 50B. The outer shapes of the first and second electronic components 20 and 30 in one or more embodiments are substantially square in a plan view. Specifically, the outer shape of the first electronic component 20 is configured with four sides 21a to 21d having the same length, and in which the intersecting sides are perpendicular to each other in a plan view. On the other hand, the outer shape of the second electronic component 30 is configured with four sides 31a to 31d having the same length, and in which the intersecting sides are perpendicular to each other in a plan view.

Herein, as illustrated in FIGS. 1(a) and 1(b), a direction (hereinafter, also simply referred to as a "planned stretching direction D") in which stretching and contracting of the stretchable board 1 is caused by an external force or the like is indicated by outline arrows. The planned stretching direction D is, for example, a longitudinal direction of the stretchable board 1, a direction in which a plurality of terminal groups (not illustrated) for external connection on the stretchable board 1 face each other, a direction in which an amount of change is the largest in the state that the stretchable board 1 is stretched (contracted), or the like. In addition, the planned stretching direction D is substantially coincident with the X direction in the figure.

In the outer shape of the first electronic component 20 being substantially square, the sides 21b and 21d extend along the planned stretching direction D, and the sides 21a and 21c extend in a direction substantially perpendicular to the planned stretching direction D. On the other hand, in the outer shape of the second electronic component 30 being substantially square, the sides 31b and 31d extend along the planned stretching direction D, and the sides 31a and 31c extend in a direction substantially perpendicular to the planned stretching direction D.

Here, the entire side 21a of the first electronic component 20 and the entire side 31a of the second electronic component 30 face each other, so that the first and second electronic components 20 and 30 are arranged to face each other in the planned stretching direction D. The "side 21a" in one or more embodiments corresponds to an example of the "first side" in one or more embodiments of the invention, the "side 21b" in one or more embodiments corresponds to an example of the "second side" in one or more embodiments of the invention, the "side 31a" in one or more embodiments corresponds to an example of the "third side" in one or more embodiments of the invention, and the "side 31b" in one or more embodiments corresponds to an example of the "fourth side" in one or more embodiments of the invention.

In general, as the first and second electronic components 20 and 30, there may be exemplified packaged products such as ICs and sensors, resistive components, capacitors, inductors, LEDs (light emitting diodes), CSP (chip scale package), and the like.

The first and second electronic components 20 and 30 are provided with a plurality (three for example) of electrodes 22 and 32, respectively. The electrodes 22 and 32 in one or more embodiments are formed so that portions thereof protrude from the outer shape (more specifically, sides 21b and 31b) of the first and second electronic components 20 and 30 and are arranged to face the non-facing zone Z2

(described later). In addition, the shape of the electrodes 22 and 32 is not particularly limited to the above-described shape. For example, the shape thereof may be SOP (small outline package), SOJ (small outline j-leaded), SON (small outline no lead package), QFN (quad fiat non-lead package), BGA (ball grid array), or the like. In a case where the shape of the electrode is SOJ, SON, QFN, or BOA, a portion of the electrode is arranged on the bottom surface of the electronic component.

Here, the entire side 21a of the first electronic component 20 and the entire side 31a of the second electronic component 30 face each other. However, the invention is not particularly limited thereto, and as illustrated in FIG. 2(*a*), the first electronic component 20 and the second electronic component 30 may be arranged so that at least a portion (a portion of the side 21a in FIG. 2(*a*)) of the first electronic component 20 and at least a portion (a portion of the side 31a in FIG. 2(*a*)) of the second electronic component 30 face each other in the planned stretching direction D.

In addition, the outer shapes of the first and second electronic components 20 and 30 are substantially square. However, the invention is not particularly limited thereto. For example, the outer shapes of the first and second electronic components 20 and 30 may be a quadrilateral shape such as a rectangular shape. Alternatively, the outer shapes of the first and second electronic components 20 and 30 may be circular. In addition, as illustrated in FIG. 2(*b*), the outer shapes of the first and second electronic components 20 and 30 may be different from each other.

The "first electronic component 20" in one or more embodiments corresponds to an example of a "first electronic component" in one or more embodiments of the invention, and the "second electronic component 30" in one or more embodiments corresponds to a "second electronic component".

A plurality (three for example) of wires 40 are arranged on the base material 10. As illustrated in FIG. 1(*a*), the outer shape of the wire 40 in one or more embodiments includes a straight-line portion 41 and inclined portions 42. In the outer shape of the wire 40, the straight-line portion 41 is a portion extending substantially in parallel with the planned stretching direction D. In the outer shape of the wire 40, the inclined portions 42 are portions extending from both ends of the straight-line portion 41 toward the first and second electronic components 20 and 30. In one or more o embodiments, the inclined portions 42 are inclined at an angle of 45 degrees with respect to the straight-line portion 41 toward the first and second electronic components 20 and 30. By configuring the outer shape of the wires 40 to be the above-described outer shape, in comparison with a case where bent portions of the wires are perpendicular, concentration of stress hardly occurs, and disconnection of the wires 40 is suppressed.

As illustrated in FIG. 3, the wire 40 includes a conductive portion 43, an insulating portion 44, and a connection terminal 45. The conductive portion 43 is provided directly on the base material 10. Here, the conductive portion 43 may be made of a material having stretchability and conductivity.

As a specific example of the material constituting the conductive portion 43, there may be exemplified a conductive mixed substance in which conductive particles are contained in an elastomer and the elastomer is allowed to function as a binder. The conductive mixed substance may be configured so that the ratio of the weight of the conductive particles to the weight of the entire conductive mixed substance is in a range of 75% to 95%. As the material constituting the conductive portion 43, besides the above-described components, additives such as an antioxidant, a flame retardant, a softening agent and the like may be further contained.

As the elastomer constituting the conductive portion 43, there may be exemplified an organic polymer such as vinyl, polyester, phenol, acrylic, epoxy, olefin, urethane, or silicone. It is preferable in some embodiments that the conductive particles have a shape of being, for example, scaly or irregular. As the conductive particles, there may be exemplified a metal such as gold, silver, platinum, ruthenium, lead, tin, zinc, bismuth and the like or an alloy thereof, a nonmetal such as carbon and conductive polymers and the like, and the like.

In addition, the material constituting the conductive portion 43 is not particularly limited to the above-described materials, and for example, materials disclosed in JP 2010-539650 W may be used. Specifically, the conductive portion 43 may be a material in which a silver plating filler is contained in a binder made of a thermoplastic resin, a thermosetting resin, or a mixture of the thermoplastic resin and the thermosetting resin. The silver plating filler is formed by covering the outer periphery of a core with conductive silver plating. However, the core may be conductive or non-conductive.

In addition, in one or more embodiments, the conductive portion 43 is stretchable by a material having stretchability. However, it is not particularly limited thereto. For example, the conductive portion 43B (wire 40B) may be formed in a zigzag shape (refer to FIG. 4), a snake shape, a horseshoe shape, or the like, so that the conductive portion 43B (wire 40B) may be stretchable in terms of the shape. In other words, in the conductive portion 43B having the shape exemplified above, the stress generated by stretching is dispersed over the entire conductive portion 43B without being concentrated on the base portion of the conductive portion 43B, so that the destruction of the conductive portion 43 is suppressed. In addition, the conductive portion 43 may be formed in a mesh shape.

The insulating portion 44 is formed so as to cover the conductive portion 43. In one or more embodiments, the insulating portion 44 is formed so as to cover the conductive portion 43. However, it is not particularly limited thereto, and it may be formed so as to cover the entire zone of the base material 10.

According to one or more embodiments, as a material constituting the insulating portion 44, the material has stretchability and electric insulating property, and the material has mechanical strength and abrasion resistance to the extent that the conductive portion 43 to be covered can be protected. As a specific example of the material constituting the insulating portion 44, for example, the same material as the material constituting the base material 10 may be exemplified.

The connection terminals 45 are formed at both ends of the wire 40 and are electrically connected to the conductive portion 43. In addition, the connection terminal 45 is not covered with the insulating portion 44, the surface thereof is exposed to the outside, and can be electrically connected to the connector 50A on the one end portion of the wire 40, and can be electrically connected to the connector 50B on the other end of the wire 40.

The connection terminal 45 in one or more embodiments is made of the same material as the material constituting the conductive portion 43, and gold, silver, nickel, palladium, or the like is applied to the surface of the connection terminal 45. Therefore, it is possible to improve the connection strength of the connectors 50A and 50B being in contact with the connection terminal 45, decrease the contact resistance, and improve the resistance to ion migration. In addition, the substance applied to the surface of the connection terminal 45 is not particularly limited to the above-described substances. Here, as described above, gold, silver, nickel, palladium or the like may be applied to the surface of the connection terminal 45. However, such a substance may not be applied to the surface of the connection terminal 45. The "wire 40" in one or more embodiments corresponds to an example of a "wire."

The connector 50A is provided so as to contact the electrode 22 and the connection terminal 45 in a state where the first electronic component 20 and the wire 40 are arranged on one main surface of the base material 10. On the other hand, the connector 50B is provided so as to contact the electrode 32 and the connection terminal 45 in a state where the second electronic component 30 and the wire 40 are arranged on one main surface of the base material 10. The electrodes 22 and 32 and the connection terminal 45 corresponding to the connectors 50 A and 50B are electrically connected by the connectors 50A and 50B. In other words, the first and second electronic components 20 and 30 are electrically connected to each other through the wire 40 by the connectors 50A and 50B. In addition, the first and second electronic components 20 and 30 are mechanically connected to the base material 10 (specifically, the connection terminal 45) by the connectors 50A and 50B (namely, the first and second electronic components 20 and 30 are mounted on the base material 10).

The connectors 50A and 50B are not particularly limited, but there may be exemplified solder, a conductive adhesive, an anisotropic conductive film, and the like. In some embodiments where the shapes of the electrodes 22 and 32 are SOP, SOJ, SON, or QFN, it is preferable to use a solder or a conductive adhesive. On the other hand, in other embodiments where the electrodes 22 and 32 have a BGA shape, it is preferable to use solder or an anisotropic conductive film. The "connector 50A" that electrically connects the first electronic component 20 and the wire 40 in one or more embodiments corresponds to an example of a "first connector" in one or more embodiments of the invention, and the "connector 50B" that electrically connects the second electronic component 30 and the wire 40 in one or more embodiments corresponds to an example of a "second connector" in one or more embodiments of the invention.

The underfill 60 is filled in the gaps between the base material 10 and the first and second electronic components 20 and 30. By the underfill 60 supporting the first and second electronic components 20 and 30 from the lower portions, a leveling accuracy of the first and second electronic components 20 and 30 to be mounted is improved. In addition, by the underfill 60 supporting the entire lower portions of the first and second electronic components 20 and 30 and by the surface of the underfill 60 receiving loads of the first and second electronic components 20 and 30, concentration of the stress on the connectors 50A and 50B which mechanically connect the base material 10 (specifically, the wire 40) and the first and second electronic components 20 and 30 is prevented. Therefore, destruction of the connectors 50A and 50B is suppressed. As a material constituting the underfill 60, the same material as the base material 10 may exemplified. In addition, in the stretchable board 1 of one or more embodiments of the invention, the underfill 60 is not necessarily indispensable and may be omitted as necessary.

Figure 5:
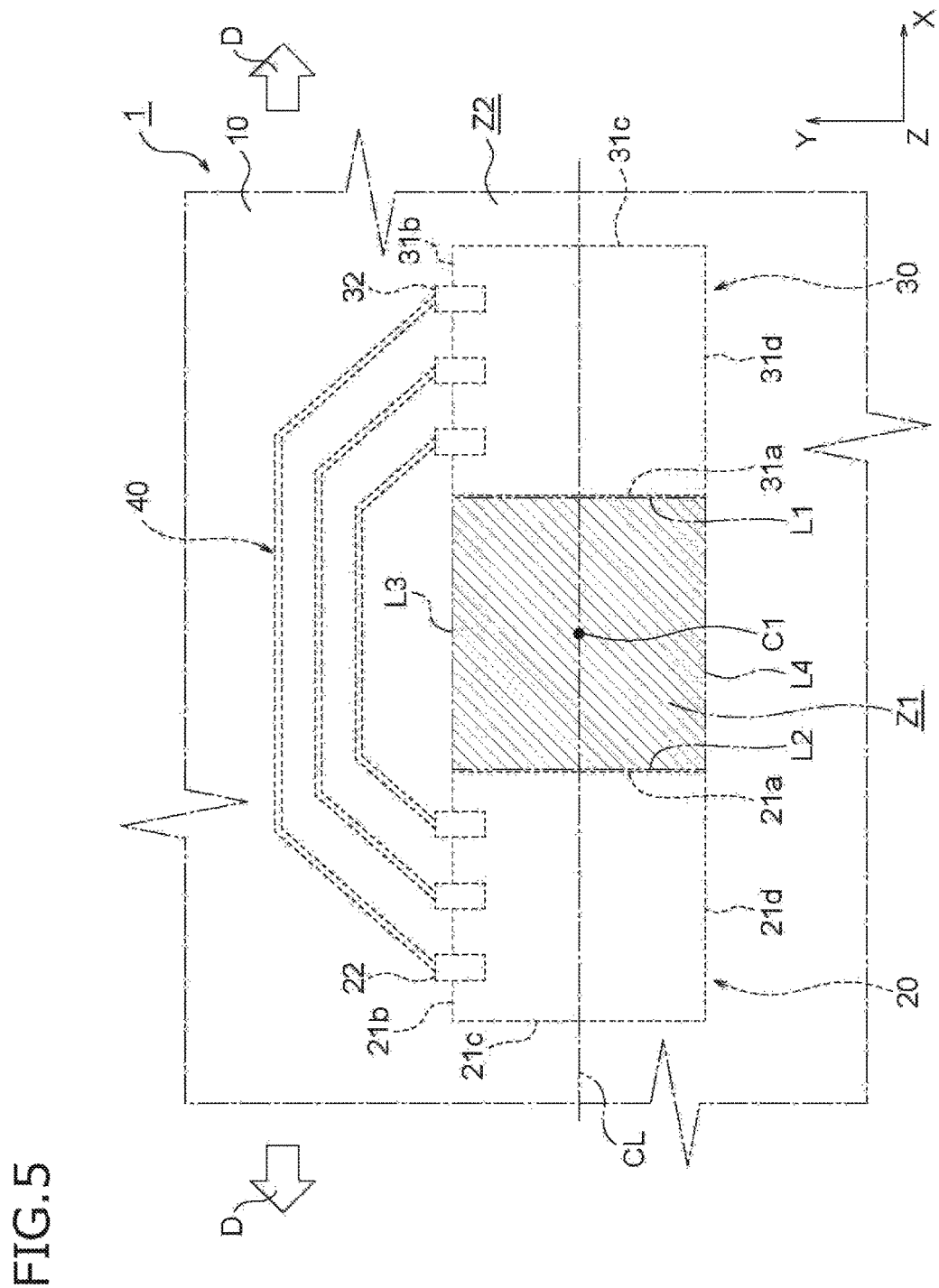
FIG. 5 is a plan view illustrating a positional relationship between a facing zone and a non-facing zone of the stretchable board according to one or more embodiments of the invention.

As illustrated in FIG. 5, the base material 10 of the stretchable board 1 described above is configured with only the facing zone Z1, and the non-facing zone Z2 on a main surface on which a circuit including the first and second electronic components 20 and 30 and the wires 40 is arranged in a plan view. In addition, although the base material is configured with only two zones of the facing zone Z1 and the non-facing zone Z2. However, the invention is not particularly limited thereto. In addition, FIG. 5 is a plan view illustrating a positional relationship between the facing zone and the non-facing zone of the stretchable board according to one or more embodiments of the invention. In FIG. 5, the facing zone Z1 is indicated by hatching slanted left downward, and the non-facing zone Z2 is illustrated in plain.

The facing zone Z1 is a zone interposed between the first and second electronic components 20 and 30 in the planned stretching direction D and is a zone defined by the first and second projection lines L1 and L2 and the first and second virtual lines L3 and L4. The first projection line L1 is a line segment obtained by projecting the first electronic component 20 onto the second electronic component 30 along the planned stretching direction D. The second projection line L2 is a line segment obtained by projecting the second electronic component 30 onto the first electronic component 20 along the planned stretching direction D. In addition, in one or more embodiments, since the first and second electronic components 20 and 30 have the same shape face each other, the first projection line L1 and the second projection line L2 have the same length.

The first virtual line L3 is a line segment that is parallel to the planned stretching direction D passing through one end portion (upper side in the figure) of the first projection line L1 and one end portion (upper side in the figure) of the second projection line L2. The second virtual line L4 is a line segment that is parallel to the planned stretching direction D passing through the other end portion (lower side in the figure) of the first projection line L1 and the other end portion (lower side in the figure) of the second projection line L2. In addition, the non-facing zone Z2 is a zone other than the facing zone Z1 of the base material 10.

Since the facing zone Z1 is interposed between the two non-stretchable electronic components 20 and 30, the stress caused by the stretching and contracting of the stretchable board 1 is easily concentrated on the facing zone Z1. Here, by providing the wires 40 in the non-facing zone Z2 while avoiding the facing zone Z1, the destruction of the wires 40 is suppressed, and the destruction of the connectors 50A and 50B is suppressed. In addition, in the facing zone Z1, the length of the first or second virtual line L3 or L4 may be 0.1 times or more and 10 times or less the length of the first or second projection line L1 or L2.

In addition, in one or more embodiments, in a plan view, the side 21a of the first electronic component 20 and the side 31a of the second electronic component 30 face each other, and the wires 40 are led out from the side 21b in the first electronic component 20. On the other hand, the wires 40 are led out from the side 31b in the second electronic component 30. In this case, the side 21b and the side 31b are located substantially on the same side with respect to a virtual center line CL in a plan view.

By leading out the wires 40 as described above, it is possible to shorten the length of the wires 40 in comparison with a case where the wires 40 are led out from the side substantially different from the virtual center line CL in a plan view. In addition, by suppressing the area occupied by the wires 40 on the base material 10, a zone for mounting other electronic components and the like is widely secured, so that high density mounting of the circuit can be performed on the entire stretchable board 1.

In addition, the direction in which the wires 40 are led out from the first and second electronic components 20 and 30 is not particularly limited to the above-described direction. For example, in a plan view, the wires 40 may be led out from the side 21d in the first electronic component 20, and the wires 40 may be led out from the side 31d in the second electronic component 30. Even in this case, the sides 21d and 31d are located substantially on the same side with respect to the virtual center line CL in a plan view, so that the length of the wires 40 can be shortened and high density mounting of the circuit can be performed. In addition, in this case, the electrodes 22 and 32 are provided corresponding to the portions where the wires 40 are led out from the first and second electronic components 20 and 30. In other words, the electrode 22 of the first electronic component 20 is provided so as to correspond to the side 21d, and the electrode 32 of the second electronic component 30 is provided so as to correspond to the side 31d. In other words, in the case, the "side 21d" in one or more embodiments corresponds to an example of a "second side" in one or more embodiments of the invention, and the "side 31d" in one or more corresponds to an example of a "fourth side" in one or more embodiments of the invention.

In addition, according to the arrangement of the circuit formed on the base material 10, in a case where it is difficult to lead out the sides (for example, the side 21b and the side 31b or the sides 21d and the side 31d) located on substantially the same side with respect to the virtual center line CL of the first and second electronic components 20 and 30, the wires 40 may be led out from different directions. Specifically, the wires 40 may be led out from the side 21b in the first electronic component 20, and the wires 40 may be led out from the side 31c or the side 31d in the second electronic component 30. Similarly, the wires may be led out from the side 21c in the first electronic component 20, and the wires 40 may be led out from the side 31b, the side 31c, or the side 31d in the second electronic component 30. Alternatively, the wires 40 may be led out from the side 21d in the second electronic component 20, and the wires 40 may be led out from the side 31b or the side 31c in the second electronic component 30. Even in the case, it is preferable that the entire wires 40 are provided in the non-facing zone Z2 while avoiding the facing zone Z1 in a plan view.

Figure 6:
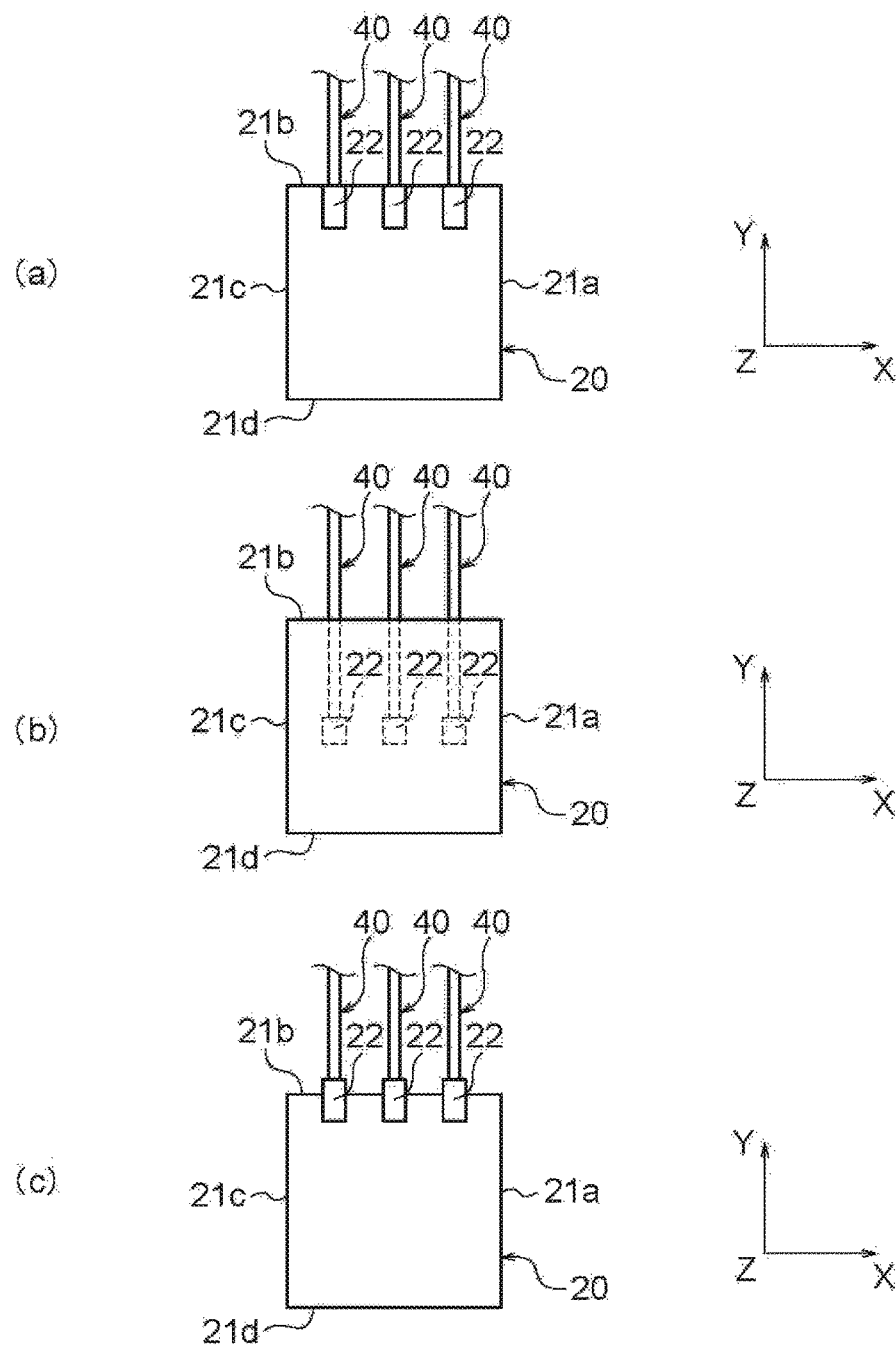
FIGS. 6(a) to 6(c) are plan views illustrating a positional relationship between the electronic component and the wires in one or more embodiments of the invention.

In one or more embodiments, "to lead out a wire from a side" of an electronic component includes the case of connecting a wire to an electrode formed along the outer shape of an electronic component, the case of connecting a wire to an electrode formed on the bottom surface of an electronic component, and the case of connecting a wire to an electrode formed to protrude from the outer shape of an electronic component. FIGS. 6(a) to 6(c) are plan views illustrating a positional relationship between the electronic component and the wires in one or more embodiments of the invention.

For example, as illustrated in FIG. 6(a), in a case where the electrode 22 is formed along the outer shape (specifically, the side 21b) of the first electronic component 20, if the electrode 22 and the wires 40 are connected, the wires 40 are led out from the first electronic component 20 so as to be in contact with the side 21b. In addition, as illustrated in FIG. 6(b), in a case where the electrode 22 is formed on the bottom surface of the first electronic component 20, if the electrode 22 and the wires 40 are connected, the wires 40 are led out from the first electronic component 20 so as to intersect the side 21b. On the other hand, as illustrated in FIG. 6(c), in a case where the electrode 22 is formed to protrude from the outer shape of the first electronic component 20 and the wires 40 are connected to the protruding portion of the electrode 22, the wires 40 are provided to be separated from the side 21b, and in this case, the wires 40 are led out from the side 21b through the electrode 22.

In addition, the virtual center line CL in one or more embodiments is a line segment extending along the planned stretching direction D passing through the center C1 of the facing zone Z1. In addition, the "center" may indicate the barycentric position in a plan view. Herein, the "barycenter" denotes the center of mass when the inside of the contour in a plan view is distributed with a uniform mass. The "facing zone Z1" in one or more embodiments corresponds to an example of a "facing zone" in one or more embodiments of the invention, and the "non-facing zone Z2" in one or more embodiments corresponds to an example of a "non-facing zone" in one or more embodiments of the invention.

Next, a method of manufacturing the stretchable board 1 according to one or more embodiments will be described with reference to FIG. 7.

Figure 7:
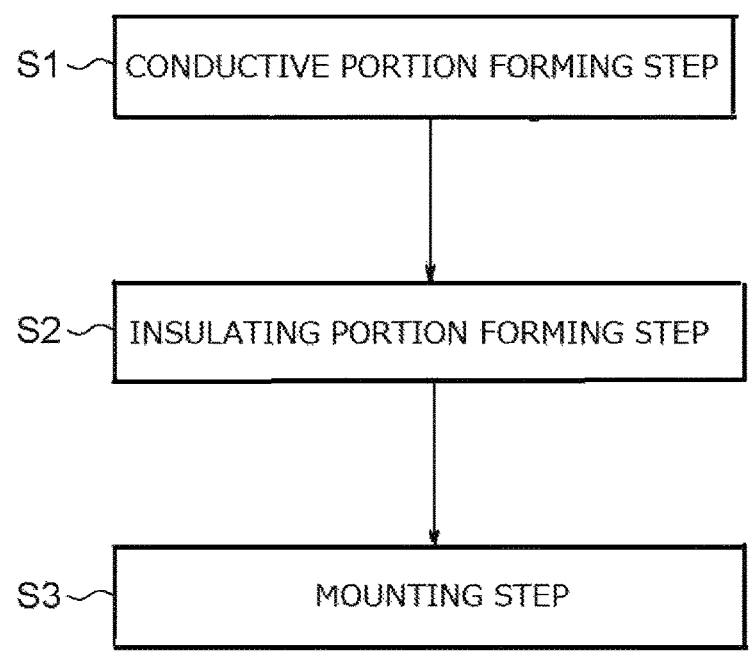
FIG. 7 is a flowchart illustrating a method of manufacturing the stretchable board according to one or more embodiments of the invention.

FIG. 7 is a flowchart illustrating a method of manufacturing the stretchable board according to one or more embodiments of the invention.

As illustrated in FIG. 7, the method of manufacturing the stretchable board 1 according to one or more embodiments includes a conductive portion forming step S1, an insulating portion forming step S2, and a mounting step S3. In the conductive portion forming step S1, a material for the conductive portion made of a conductive paste is printed on the base material 10 by a screen printing method to form a predetermined wire pattern. After the wire pattern is formed, the base material 10 on which the wire pattern is formed is heated in a conveyor furnace to cure the wire pattern, so that the conductive portion 43 is formed. In addition, in one or more embodiments, in the conductive portion forming step S1, the connection terminal 45 is formed in accordance with the conductive portion 43.

The method of forming the conductive portion 43 is not particularly limited to the above-described method. For example, after a conductive layer is formed on a base material by a film formation method such as a plating method, a vapor deposition method, a sputtering method, or the like, a predetermined pattern may be formed by etching using photolithography. In addition, the conductive portion 43 and the connection terminal 45 may be formed in combination in one printing process. However, the invention is not particularly limited to the above-described process, and the conductive portion and the connection terminal may be formed in different processes.

Next, in the insulating portion forming step S2, a material for the insulating portion made of an insulating paste is printed on the conductive portion 43 by a screen printing method. Then, the base material 10 on which the material for the insulating portion is printed is heated in a conveyor furnace to cure the material for the insulating portion, so that the insulating portion 44 is formed. In addition, the method of forming the insulating portion 44 is not particularly limited to the above-described method, and the insulating portion 44 may be directly laminated on the conductive portion 43.

Next, in the mounting step S3, first, a material for the connector made of solder paste is printed on the connection terminal 45 by a stencil printing method. As described above, the first and second electronic components 20 and 30 are mounted on the base material 10 by a connection method using solder. However, the first and second electronic components 20 and 30 may be mounted on the base material 10 by a connection method using the conductive adhesive or the anisotropic conductive film described above.

Then, the first and second electronic components 20 and 30 are placed on the base material 10 so that the electrodes 22 and 32 are in contact with the printed material for the connector. At this time, while adjusting the positions of the electrodes 22 and 32 and the positions of the material for the connector by using a mounting jig (so-called chip mounter), the first and second electronic components 20 and 30 are placed on the base material 10. Then, the material for the connector and the base material 10 provided with the first and second electronic components 20 and 30 are reflow-heated to melt the material for the connector. Then, the material for the connector is cooled and solidified by a method such as natural cooling to form the connectors 50A and 50B. As a result, the first and second electronic components 20 and 30 are electrically and mechanically connected to the base material 10 (specifically, the connection terminal 45). Therefore, the stretchable board 1 having the circuit is obtained.

The stretchable board 1 according to one or more embodiments has the following effects.

In general, in a circuit formed on a board, in a case where two electronic components are electrically connected through wires, the electronic components are provided so that the length of the wires is minimized as short as possible. In other words, by providing the wires so as to connect the two electronic components linearly, the length of the wires is minimized as short as possible. However, in the case of a stretchable board, by providing the wires so as to connect the two electronic components linearly, the stress caused by the stretching and contracting of the stretchable board is easily concentrated on a zone (the zone corresponding to the "facing zone Z1" in one or more embodiments) interposed between two non-stretchable electronic components in comparison with a zone other than the zone. Therefore, if the connectors for connecting the electronic components and the wires are arranged in a zone interposed between the two electronic components, there is a possibility that the connector is destructed by the stress caused by the stretching and contracting of the stretchable board. In addition, since the wires are arranged in a zone interposed between the two electronic components according to the positions where the connectors are formed, cracks or the like may occur in the wires as well as the connector by the stress caused by the stretching and contracting of the stretchable board. Then, by repeating the stretching and contracting of the stretchable board, cracks of the wires progress, eventually, the wires are destructed, and further, cracks occurring in the wires reach the connectors, so that there is a possibility that the connectors are destructed. As described above, if the connectors are destructed, an increase in the electric resistance value or disconnection (electrical insulation) between the electronic components and the wires occur, and as a result, the quality of the stretchable board is degraded. In the case of providing a stretch prevention guard which prevents the stretching and contracting of the zone including the connectors in order to suppress the destruction of the connectors, the stretch prevention guard causes a degradation in stretchability of the stretchable board.

On the other hand, in one or more embodiments, suppression of destruction of the connectors 50A and 50B caused by the stretching and contracting of the stretchable board 1 is facilitated by providing the connectors 50A and 50B in the non-facing zone Z2 where the stress caused by the stretching and contracting is hardly concentrated. In addition, the stretchable board 1 according to one or more embodiments has a simpler structure than a stretchable board provided the stretch prevention guard (that is, in the case of the technique in the related art), so that suppression of degradation in stretchability of the stretchable board 1 is facilitated.

In addition, in one or more embodiments, similarly to the connectors 50A and 50B, the wires 40 are also arranged in the non-facing zone Z2 where the stress caused by the stretching and contracting is hardly concentrated, so that cracks and the like occurring by the stress caused by the stretching and contracting of the stretchable board 1 are suppressed, so that it is possible to facilitate suppression of the destruction of the connectors 50A and 50B caused by the progression of the cracks in the wires 40.

In addition, in one or more embodiments, by providing the wires 40 in the non-facing zone Z2 while avoiding the facing zone Z1, the distortion (stretching/contracting amount) of the wires 40 is reduced, so that even if repeatedly used, the progression of the cracks occurring at the wires 40 is suppressed. As a result, the life time of the wires 40 can be extended.

In addition, in one or more embodiments, since the destruction of the connectors 50A and 50B is suppressed, the degradation of the quality of the stretchable board 1 such as the increase in the electric resistance value or the disconnection between the electronic component and the wires is suppressed.

In addition, in one or more embodiments, by configuring the outer shapes of the first and second electronic components 20 and 30 to be substantially rectangular in a plan view, it is possible to make the zone between the first and second electronic components 20 and 30 which are separated from each other relatively small. As a result, high density mounting of the circuit can be performed on the entire stretchable board 1.

In addition, in one or more embodiments, the first and second electronic components 20 and 30 are arranged so that the side 21a and the side 31a face each other in a plan view. In this case, in a plan view, the side 21b and the side 31b are located substantially on the same side with respect to the virtual center line CL. However, in this case, the wires 40 are led out from the side 21b in the first electronic component 20, and the wires 40 are led out from the side 31b in the second electronic component 30, so that the length of the wires 40 is shortened in comparison with a case where the wires 40 are led out from the sides substantially different from the virtual center line CL in a plan view. In addition, by suppressing the area occupied by the wires 40 on the base material 10, a zone for mounting other electronic components and the like is widely secured, so that high density mounting of the circuit is performed on the entire stretchable board 1.

In addition, in one or more embodiments, for example, in a case where the wires 40 are led out from the side 21b in the first electronic component 20 and the wires 40 are led out from the side 31b in the second electronic component 30, the length of the wires is minimized as short as possible. However, the invention is not limited thereto, and the wires 40 led out from the side 21b may be provided so as to circumvent the periphery of the first electronic component 20 to the sides 21c and 21d side, and the wires 40 led out from the side 31b may be provided so as to circumvent the periphery of the second electronic component 30 to the sides 31c, 31d side. In addition, similarly, even in a case where the wires 40 are led out from the side 21d in the first electronic component 20 and the wires 40 are led out from the side 31d in the second electronic component 30, the wires 40 may be provided so as to circumvent the periphery of the first and second electronic components 20 and 30.

In addition, in one or more embodiments, the entire connectors 50A and 50B are arranged in the non-facing zone. However, the invention is not particularly limited thereto, and if at least a portion of the connector 50A and at least a portion of the connectors 50B are arranged in the non-facing zone, the destruction of the connector 50A or the connector 50B caused by the stretching and contracting of the stretchable board 1 can be suppressed. Similarly, the entire wires 40 are arranged in the non-facing zone. However, the invention is not particularly limited to the above-described example as long as a portion of the wires 40 is arranged in the non-facing zone. In addition, in one or more embodiments where a portion of the connectors and a portion of the wires are arranged in the facing zone, the length of the first or second virtual line L3 or L4 in the facing zone is preferably set to be 10 times or more and 100 times or less preferably set to be 10 times or more and 100 times or less the length of the first or second projection line L1 or L2.

In addition, the first and second electronic components 20 and 30 may be mounted on the base material 10. However, the invention is not particularly limited thereto, and three or more electronic components may be mounted on the base material 10. In this case, it may be preferable to provide the wires 40 while avoiding each of the facing zones Z1 interposed between the electronic components electrically connected to each other.

In addition, in one or more embodiments, all of the plurality of wires 40 and all of the plurality of connectors 50A and 50B are arranged in the non-facing zone Z2. However, the invention is not particularly limited thereto. For example, all of the plurality of the wires 40 and all of the plurality of the connectors 50A and 50B may be arranged in a zone where two electronic components do not face each other. However, according to a mode of arrangement of the electronic components (for example, a mode where a plurality of electronic components are arranged in a matrix shape), in a case where it is difficult to provide all of the plurality of wires 40 and all of the plurality of connectors 50A and 50B in a zone where two electronic components do not face each other, the wires 40 and the connectors 50A and 50B may be arranged in the facing zones of the two electronic components which are not aligned in the planned stretching direction while avoiding the facing zones of the two electronic components in the planned stretching direction. In addition, in a case where it is difficult to provide all of the plurality of wires 40 and all of the plurality of connectors 50A and 50B in a zone where two electronic components do not face each other or in the facing zone of two electronic components not aligned in the facing planned stretching direction, a portion of the wires 40 and a portion of the connectors 50A and 50B among the plurality of wires 40 and the plurality of connectors 50A and 50B may be arranged in the non-facing zone Z2, and the other wires 40 and the other connectors 50A and 50B among the plurality of wires 40 and the plurality of connectors 50A and 50B may be arranged in the facing zone Z1. Specifically, the wires 40 (for example, wires for the power supply) having a relatively high priority and the corresponding connectors 50A and 50B are arranged in the non-facing zone Z2, and the wires 40 (for example, wires for signals) having a relatively low priority and the corresponding connectors 50A and 50B are arranged in the facing zone Z1. As described above, by providing the wires 40 and the connectors 50A and 50B having high priority in the non-facing zone Z2, it is possible to suppress the degradation of the quality of the stretchable board 1 caused by the destruction of the wires 40 and the destruction of the connectors 50A and 50B. In addition, by providing the wires 40 and the connectors 50A and 50B having low priority in the facing zone Z1, it is possible to perform high-density mounting of the circuit on the entire stretchable board 1.

A stretchable board 1E according to one or more embodiments of the invention corresponds to the stretchable board 1 in the state before the first and second electronic components 20 and 30 are mounted on the base material 10 of the stretchable board 1 described above. Hereinafter, another configuration of the stretchable board 1E according to one or more embodiments will be described with reference to FIG. 8.

Figure 8:
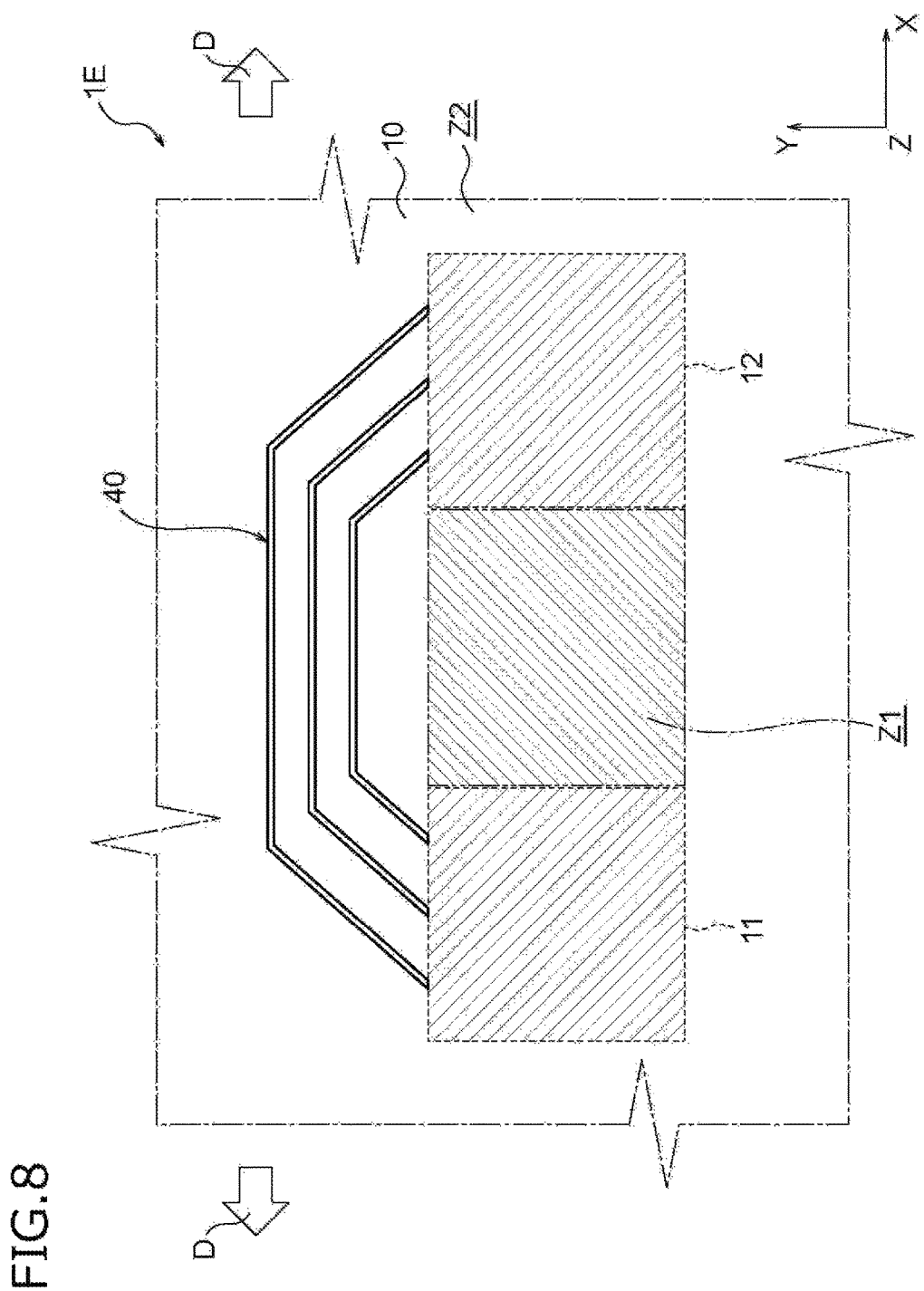
FIG. 8 is a plan view illustrating a schematic configuration of a stretchable board according to one or more embodiments of the invention.

FIG. 8 is a plan view illustrating a schematic configuration of the stretchable board according to one or more embodiments of the invention.

As illustrated in FIG. 8, the stretchable board 1E according to one or more embodiments is configured to include first and second mounting portions 11 and 12 on which the first and second electronic components 20 and 30 can be mounted in a plan view. The first and second mounting portions 11 and 12 have an area to the extent that the first and second electronic components 20 and 30 can be mounted. In addition, similarly to the positional relationship between the first and second electronic components 20 and 30 described above, the first and second mounting portions 11 and 12 are arranged to face each other in the planned stretching direction D.

In one or more embodiments, the planar shapes of the first and second mounting portions 11 and 12 are formed to be rectangular shapes corresponding to the shapes of the first and second electronic components 20 and 30. However, the invention is not particularly limited thereto. For example, the planar shapes of the first and second mounting portions 11 and 12 may be a quadrilateral shape such as a rectangular shape. Alternatively, the planar shapes of the first and second mounting portions 11 and 12 may be circular. In addition, the planar shapes of the first and second mounting portions 11 and 12 may be different from each other.

In one or more embodiments, a zone interposed between the first and second mounting portions 11 and 12 in the base material 10 is defined as the facing zone Z1. In addition, a zone being other than the facing zone Z1 of the base material 10 and including the first and second mounting portions 11 and 12 in the base material 10 is defined as the non-facing zone Z2. Then, by providing the wires 40 in the non-facing zone Z2 while avoiding the facing zone Z1, the connectors 50A and 50B are also provided to correspond to the wires 40 in the non-facing zone Z2, so that the destruction of the connectors 50A and 50B caused by the stretching and contracting of the stretchable board 1 is suppressed.

In FIG. 8, the facing zone Z1 is indicated by hatching slanted-left downward, and the first and second mounting portions 11 and 12 are indicated by hatching slanted right downward, and a zone other than the first and second mounting portions 11 and 12 in the non-facing zone Z2 is illustrated in plain. The "first mounting portion 11" in one or more embodiments corresponds to an example of a "first mounting portion" in one or more embodiments of the invention, and the "second mounting portion 12" in one or more embodiments corresponds to an example of a "second mounting portion" in one or more embodiments of the invention.

Figure 9:
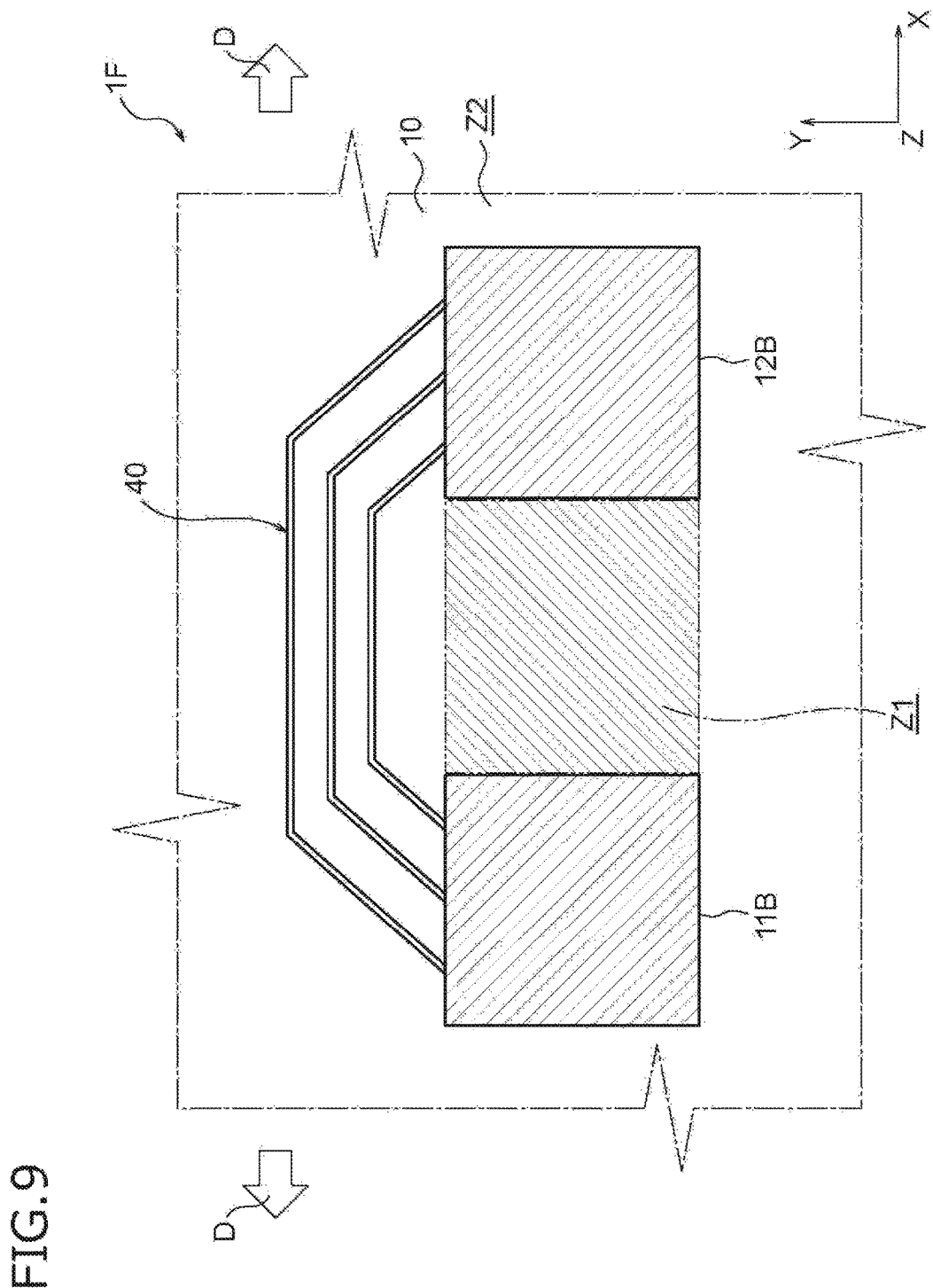
FIG. 9 is a plan view illustrating a schematic configuration of Modified Example of the stretchable board according to one or more embodiments of the invention.

In this specification, the "first and second mounting portions 11 and 12 that can be mounted" are zones which are arranged in advance in consideration of the outer diameter of the electronic components with the intention of mounting the electronic components. An example of the feature of the zone is that the connection terminal is overlapped with the side of the zone, the side of the connection terminal is inscribed or circumscribed on the sides of the zone, and the connection terminal is enclosed in the zone. In addition, for example, by marking the base material by using a silk screen printing method, an inkjet method, or the like, the first and second mounting portions are formed so as to be distinguished from the portions other than the first and second mounting portions. Alternatively, as illustrated in FIG. 9, by configuring the first and second mounting portions with a material different from that of the main body of the base material, the first and second mounting portions may be formed so as to be distinguished from the portions other than the first and second mounting portions. FIG. 9 is a plan view illustrating a schematic configuration of Modified Example of the stretchable board according to one or more embodiments of the invention.

Similarly to the case of the stretchable board 1F illustrated in FIG. 9, in a case where the first and second mounting portions 11B and 12B are made of a material different from that of the main body of the base material 10, the first and second mounting portions 11B and 12B may be made of a material having a relatively large Young's modulus (E2) in comparison with the Young's modulus (E1) of the material constituting the main body of the base material 10 (E2>E1). In this case, by mounting the electronic components on the first and second mounting portions 11B and 12B having a relatively large Young's modulus, it is possible to suppress the destruction of the electronic components caused by the stretching and contracting of the stretchable board 1F.

In one or more embodiments, it is preferable that the Young's modulus (E2) of the material constituting the first and second mounting portions 11B and 12B is set to be twice or more the Young's modulus (E1) of the material constituting the base material 10 (E2≥2×E1).

Figure 10:
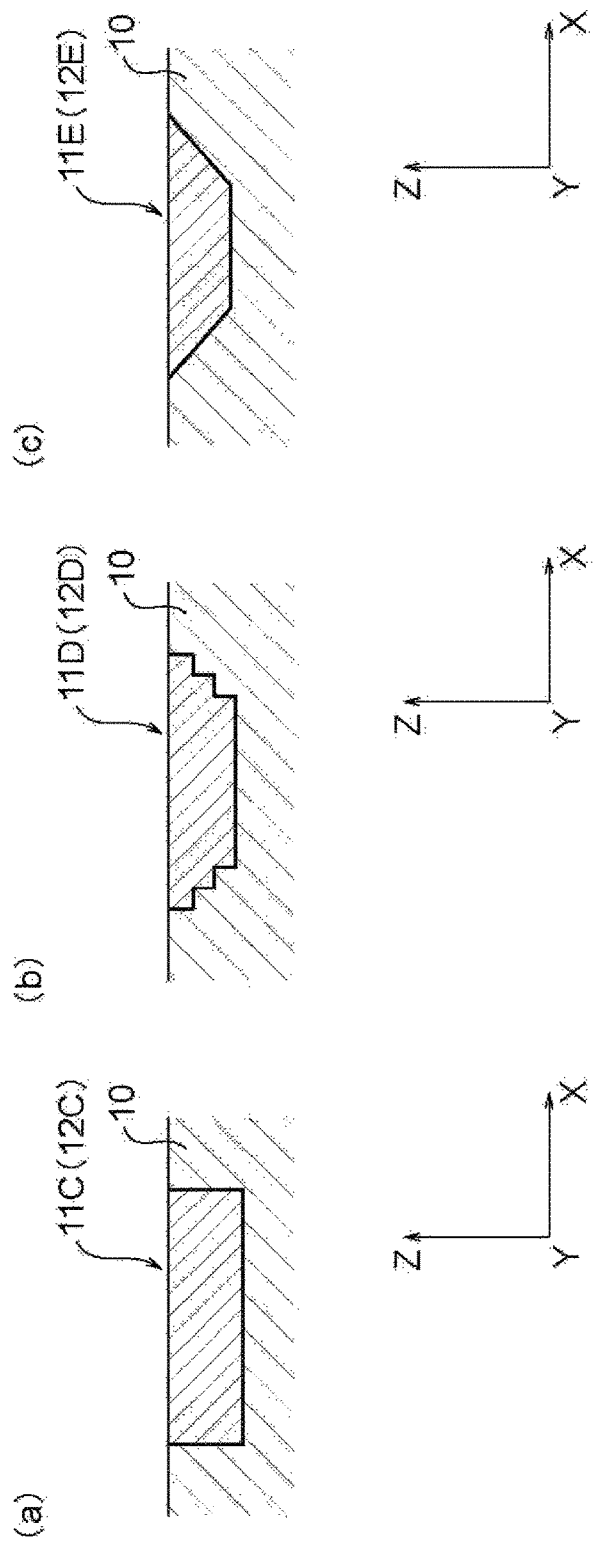
FIGS. 10(a) to 10(c) are cross-sectional views illustrating Modified Examples of the first and second mounting portions in one or more embodiments of the invention.

The cross-sectional shapes of the first and second mounting portions 11B, 12B are not particularly limited. FIGS. 10(a) to 10(c) are cross-sectional views illustrating Modified Examples of the first and second mounting portions in one or more embodiments of the invention.

For example, as illustrated in FIG. 10(a), the first and second mounting portions 11C and 12C may have a rectangular cross-sectional shape. Alternatively, as illustrated in FIG. 10(b), the first and second mounting portions 11D and 12D may have a cross-sectional shape that gradually becomes thinner toward the outside of the first and second mounting portions 11D and 12D. Alternatively, as illustrated in FIG. 10(c), the first and second mounting portions 11E and 12E have a cross-sectional shape that stepwise becomes thinner toward the outside of the first and second mounting portions 11E and 12E.

As illustrated in FIG. 10(b) and FIG. 10(c), in a case where the cross-sectional shape of the first and second mounting portions has a cross-sectional shape that gradually or stepwise becomes thinner toward the outside, a change (curing change) in elongation ratio between the main body of the base material and the first and second mounting portions becomes gentle, so that concentration of the stress on the wires and connection at the boundary between the main body of the base material and the first and second mounting portions can be weakened, it is possible to suppress the destruction of the wires and the connectors.

Although the base material 10 of the stretchable board 1E according to one or more embodiments includes the first and second mounting portions 11 and 12, it is not limited thereto, and the base material may include three or more mounting portions.

The stretchable board 1E according to one or more embodiments has the following effects.

In the stretchable board 1E according to one or more embodiments, the wires 40 are arranged in the non-facing zone Z2 avoiding the facing zone Z1 interposed between the first and second mounting portions 11 and 12. The first and second electronic components 20 and 30 described in one or more embodiments are mounted corresponding to the first and second mounting portions 11 and 12, so that according to the stretchable board 1E, it is possible to achieve the same functions and effects as those of the stretchable board 1 described above.

Although the disclosure has been described with respect to only a limited number embodiments, those skilled in the art, having benefit of this disclosure, will appreciate that various other embodiments may be devised without departing from the scope of the present invention. Accordingly, the scope of the invention should be limited only by the attached claims For example, the stretchable board 1F according to the modified example includes the first and second mounting portions 11 and 12 made of a material having a relatively large Young's modulus in comparison with the Young's modulus of the material constituting the main body of the base material 10. However, the first and second mounting portions 11b and 12B may also be applied to the stretchable board.

EXPLANATIONS OF LETTERS OR NUMERALS 1, 1B to 1F stretchable board
10 base material
Z1 facing zone
L1 first projection line
L2 second projection line
L3 third virtual line
L4 fourth virtual line
Z2 non-facing zone
11, 11B to 11E first mounting portion
12, 11B to 11E second mounting portion
20, 20B first electronic component
21a to 22d side
22 electrode
30 second electronic component
31a to 31d side
32 electrode
40, 40B wires
41 straight-line portion
42 inclined portion
43 conductive portion
44 insulating portion
45 connection terminal
50A, 50B connector
60 underfill
D planned stretching direction

The invention claimed is:
1. A stretchable board comprising:
a base material having stretchability; a first electronic component mounted on the base material; a second electronic component mounted on the base material; a wire arranged on the base material;
a first connector electrically connecting the first electronic component and the wire to each other; and a second connector electrically connecting the second electronic component and the wire to each other, wherein at least a portion of the first electronic component and at least a portion of the second electronic component face each other in a planned stretching direction of the stretchable board, wherein the base material includes:

a facing zone interposed between the first and second electronic components in the planned stretching direction; and a non-facing zone other than the facing zone on the base material, wherein at least a portion of the first connector and at least a portion of the second connector are arranged in the non-facing zone, and wherein the wire is arranged in the non-facing zone;

wherein the facing zone in plan view consists of an area enclosed by:

a first projection line segment obtained by projecting the first electronic component onto the second electronic component along the planned stretching direction; a second projection line segment obtained by projecting the second electronic component onto the first electronic component along the planned stretching direction; a first virtual line segment parallel to the planned stretching direction passing through either a top of the first component and intersecting the first projection line segment or a top of the second component and intersecting the second projection line segment; and a second virtual line segment parallel to the planned stretching direction passing through either a bottom of the first component and intersecting the first projection line segment or a bottom of the second component and intersecting the second projection line segment, and wherein the wire is arranged in the non-facing zone and not in the facing zone.

2. The stretchable board according to claim 1, wherein outer shapes of the first and second electronic components are substantially rectangular shapes having four sides in a plan view.

3. The stretchable board according to claim 2, wherein the outer shape of the first electronic component, in a plan view, includes:

a first side substantially perpendicular to the planned stretching direction; and a second side intersecting the first side, wherein the outer shape of the second electronic component, in a plan view, includes:

a third side substantially perpendicular to the planned stretching direction; and a fourth side intersecting the third side, wherein the first and second electronic components are arranged so that the first and third sides face each other in a plan view, wherein the second and fourth sides are located substantially on the same side with respect to a virtual center line along the planned stretching direction passing through a center of the facing zone in a plan view, and wherein the wire, in a plan view, is led out from the second side and is led out from the fourth side.

4. The stretchable board according to claim 1, wherein the stretchable board includes:

a plurality of the first connectors, a plurality of the second connectors, and a plurality of the wires, and wherein all of the plurality of the first connectors, all of the plurality of the second connectors, and all of the plurality of the wires are arranged in the non-facing zone.

5. A stretchable board comprising: a base material having stretchability, and a wire arranged on the base material, wherein the base material includes first and second mounting portions on which first and second electronic components electrically connected to each other by the wire can be mounted, wherein at least a portion of the first mounting portion and at least a portion of the second mounting portion face each other in a planned stretching direction of the stretchable board, wherein the base material includes: a facing zone interposed between the first and second mounting portions in the planned stretching direction; and a non-facing zone being other than the facing zone of the base material and including the first and second mounting portions, and wherein the wire is arranged in the non-facing zone; wherein the facing zone in plan view consists of an area enclosed by: a first projection line segment obtained by projecting the first electronic component onto the second electronic component along the planned stretching direction; a second projection line segment obtained by projecting the second electronic component onto the first electronic component along the planned stretching direction; a first virtual line segment parallel to the planned stretching direction passing through either a top of the first component and intersecting the first projection line segment or a top of the second component and intersecting the second projection line segment; and a second virtual line segment parallel to the planned stretching direction passing through either a bottom of the first component and intersecting the first projection line segment or a bottom of the second component and intersecting the second projection line segment, and wherein the wire is arranged in the non-facing zone and not in the facing zone.

* * * * *